United States Patent
Yoon et al.

(10) Patent No.: US 8,362,678 B2
(45) Date of Patent: Jan. 29, 2013

(54) LAMP STRUCTURE AND LIQUID CRYSTAL DISPLAY APPARATUS HAVING THE SAME

(75) Inventors: Sang-Hyuck Yoon, Seoul (KR); Seok-Hyun Nam, Seoul (KR); Kyung-Min Kim, Asan-si (KR); So-Jin Ryu, Seoul (KR)

(73) Assignee: Samsung Display Co., Ltd. (KR)

( * ) Notice: Subject to any disclaimer, the term of this patent is extended or adjusted under 35 U.S.C. 154(b) by 89 days.

(21) Appl. No.: 12/573,694

(22) Filed: Oct. 5, 2009

(65) Prior Publication Data
US 2010/0128203 A1 May 27, 2010

(30) Foreign Application Priority Data
Nov. 27, 2008 (KR) .................. 10-2008-0118652

(51) Int. Cl.
*H01J 19/06* (2006.01)
*H01J 17/04* (2012.01)
(52) U.S. Cl. .................... 313/346 R; 313/633
(58) Field of Classification Search .............. None
See application file for complete search history.

(56) References Cited

U.S. PATENT DOCUMENTS

| | | | | |
|---|---|---|---|---|
| 3,631,303 A | * | 12/1971 | Antypas et al. | 313/346 R |
| 4,275,330 A | * | 6/1981 | Cho et al. | 313/630 |
| 4,303,846 A | * | 12/1981 | Kimura et al. | 313/558 |
| 4,415,835 A | * | 11/1983 | Mishra et al. | 313/627 |
| 5,463,271 A | * | 10/1995 | Geis et al. | 313/346 R |
| 6,091,190 A | * | 7/2000 | Chalamala et al. | 313/346 R |
| 6,806,647 B2 | * | 10/2004 | Yamamoto et al. | 313/607 |
| 2006/0208641 A1 | * | 9/2006 | Maniwa et al. | 313/623 |
| 2007/0138934 A1 | * | 6/2007 | Goto | 313/491 |
| 2008/0143925 A1 | * | 6/2008 | Kim et al. | 349/70 |

FOREIGN PATENT DOCUMENTS

| | | |
|---|---|---|
| JP | 2005251626 A | 9/2005 |
| KR | 20-0357221 | 7/2004 |
| KR | 1020080054520 A | 6/2008 |

* cited by examiner

*Primary Examiner* — Anh Mai
*Assistant Examiner* — Britt D Hanley
(74) *Attorney, Agent, or Firm* — Innovation Counsel LLP

(57) ABSTRACT

A lamp according to one or more embodiments includes a tube which forms a light-emitting space, an electrode main body which is disposed in the tube, and an emitter surface metal layer which includes an alkali metal oxide and/or an alkaline earth metal oxide, and covers the electrode main body. The emitter surface metal layer may include cesium (Cs) and may further include at least one selected from the group consisting of beryllium oxide (BeO), magnesium oxide (MgO), calcium oxide (CaO), strontium oxide (SrO), barium oxide (BaO), cesium oxide (CsO) and radium oxide (RaO). Therefore, discharge may be easily activated because of a high secondary electron emission coefficient. Thus, a light-emitting efficiency may be enhanced and dark start characteristics may be improved.

24 Claims, 11 Drawing Sheets

LAMP STRUCTURE AND LIQUID CRYSTAL DISPLAY APPARATUS HAVING THE SAME

PRIORITY STATEMENT

This application claims priority under 35 U.S.C. §119 and benefit from Korean Patent Application No. 2008-118652, filed on Nov. 27, 2008 in the Korean Intellectual Property Office (KIPO), the contents of which are herein incorporated by reference in their entirety.

BACKGROUND

1. Technical Field

Example embodiments of the present invention generally relate to a lamp, a method for manufacturing the lamp and a liquid crystal display (LCD) apparatus having the lamp. More particularly, example embodiments of the present invention relate to a lamp capable of reducing power consumption, a method for manufacturing the lamp and an LCD apparatus having the lamp.

2. Description of the Related Art

A liquid crystal display (LCD) apparatus used for an LCD monitor of a computer or an LCD television includes a backlight unit disposed at the rear of the LCD apparatus. A cold cathode fluorescent lamp (CCFL) is generally used as a light source of the backlight unit. A diameter of the CCFL is smaller than that of a conventional lamp, and the CCFL has low power consumption. Furthermore, the luminance and luminance uniformity of the CCFL are higher than those of a conventional lamp.

When electrons are emitted from electrodes at both ends of the CCFL, mercury in the CCFL is excited to emit ultraviolet rays, and a fluorescent layer converts the ultraviolet rays into visible rays.

Typically, the electrodes of the CCFL are covered with cesium (Cs) to improve dark start characteristics. According to a conventional method, the electrodes are coated with an aqueous solution containing cesium (Cs). However, the lamp coated with cesium (Cs) may not be further coated with a metal material having a high electron emission efficiency because the aqueous solution containing cesium (Cs) includes water molecules.

Particularly, the water molecules of the aqueous solution containing cesium (Cs) may react with the metal material capable of enhancing the electron emission efficiency. Thus, additional coating may be difficult to apply because light flickering is generated by the reaction. Therefore, there is a problem in that the lamp may have low light-emitting efficiency.

SUMMARY

Example embodiments of the present invention provide a lamp capable of reducing power consumption.

Example embodiments of the present invention also provide a method for manufacturing the above-mentioned lamp.

Example embodiments of the present invention also provide a liquid crystal display (LCD) apparatus having the above-mentioned lamp.

According to one embodiment of the present invention, a lamp includes a tube which forms a light-emitting space, an electrode main body which is disposed in the tube, and an emitter surface metal layer which includes an alkali metal oxide and/or an alkaline earth metal oxide, and covers the electrode main body.

In an example embodiment of the present invention, the emitter surface metal layer may include cesium (Cs), and may further include at least one of beryllium oxide (BeO), magnesium oxide (MgO), calcium oxide (CaO), strontium oxide (SrO), barium oxide (BaO), cesium oxide (CsO) and radium oxide (RaO).

In an example embodiment of the present invention, the emitter surface metal layer may include an emitter metal layer covering the electrode main body, and a surface metal layer covering the emitter metal layer.

In an example embodiment of the present invention, the emitter metal layer may include at least one of beryllium oxide (BeO), magnesium oxide (MgO), calcium oxide (CaO), strontium oxide (SrO), barium oxide (BaO), cesium oxide (CsO) and radium oxide (RaO). The surface metal layer may include Cesium (Cs).

In an example embodiment of the present invention, the emitter surface metal layer may include a surface metal layer covering the electrode main body, and an emitter metal layer covering the surface metal layer.

In an example embodiment of the present invention, the emitter metal layer may include at least one of beryllium oxide (BeO), magnesium oxide (MgO), calcium oxide (CaO), strontium oxide (SrO), barium oxide (BaO), cesium oxide (CsO) and radium oxide (RaO). The surface metal layer may include Cesium (Cs).

In an example embodiment of the present invention, the electrode main body may include at least one of nickel (Ni), molybdenum (Mo), niobium (Nb), tungsten (W), titanium (Ti), tantalum (Ta) and iron (Fe).

According to another embodiment of the present invention, there is provided a method of manufacturing a lamp. In the method, a fluorescent layer is applied in a tube which forms a light-emitting space. An electrode main body is formed by processing an electrode metal plate. An emitter surface metal layer is formed on the electrode main body by evaporating a metal material including an alkali metal oxide and/or an alkaline earth metal oxide. The electrode main body on which the emitter surface metal layer is formed on is deposited in the tube.

In an example embodiment of the present invention, the metal material may be evaporated at an electron-beam evaporator, and is formed on the electrode main body.

In an example embodiment of the present invention, the metal material includes cesium (Cs) and an oxide metal material may include an oxide. The oxide metal material may include at least one selected from the group consisting of beryllium oxide (BeO), magnesium oxide (MgO), calcium oxide (CaO), strontium oxide (SrO), barium oxide (BaO), cesium oxide (CsO) and radium oxide (RaO).

In an example embodiment of the present invention, cesium (Cs) and the oxide metal material may be simultaneously formed on the electrode main body when the emitter surface metal layer is formed.

In an example embodiment of the present invention, forming the emitter surface metal layer may include forming an emitter metal layer on the electrode main body by evaporating the oxide metal material, and forming a surface metal layer on the emitter metal layer by evaporating cesium (Cs).

In an example embodiment of the present invention, forming the emitter surface metal layer may include forming a surface metal layer on the electrode main body by evaporating cesium (Cs), and forming an emitter metal layer on the surface metal layer by evaporating the oxide metal material.

According to still another embodiment of the present invention, an LCD apparatus includes an LCD panel, a lamp providing light to the LCD panel, and including a tube which forms a light-emitting space, an electrode main body which is disposed in the tube, and an emitter surface metal layer which includes an alkali metal oxide and/or an alkaline earth metal oxide and covers the electrode main body, and an inverter providing a power to the lamp.

In an example embodiment of the present invention, the emitter surface metal layer may include cesium (Cs) and at least one metal oxide selected from the group consisting of beryllium oxide (BeO), magnesium oxide (MgO), calcium oxide (CaO), strontium oxide (SrO), barium oxide (BaO), cesium oxide (CsO) and radium oxide (RaO).

In an example embodiment of the present invention, the emitter surface metal layer may include an emitter metal layer including the metal oxide and covering the electrode main body, and a surface metal layer including cesium (Cs) and covering the emitter metal layer.

In an example embodiment of the present invention, the emitter surface metal layer may include a surface metal layer including cesium (Cs) and covering the electrode main body, and an emitter metal layer including the metal oxide and covering the surface metal layer.

In an example embodiment of the present invention, the emitter surface metal layer may include the metal oxide and cesium (Cs) which are mixed together.

According to embodiments of the present invention, a lamp electrode includes a metal material having high electron emission efficiency, thus, the temperature of the lamp electrode and lamp efficiency may be enhanced. Therefore, the power consumption of the lamp may be reduced and the power consumption of an LCD apparatus having the lamp may be reduced.

BRIEF DESCRIPTION OF THE DRAWINGS

The above and other features and advantages of the present disclosure will become more apparent by describing in detailed example embodiments thereof with reference to the accompanying drawings, in which.

DETAILED DESCRIPTION

Figure 1:
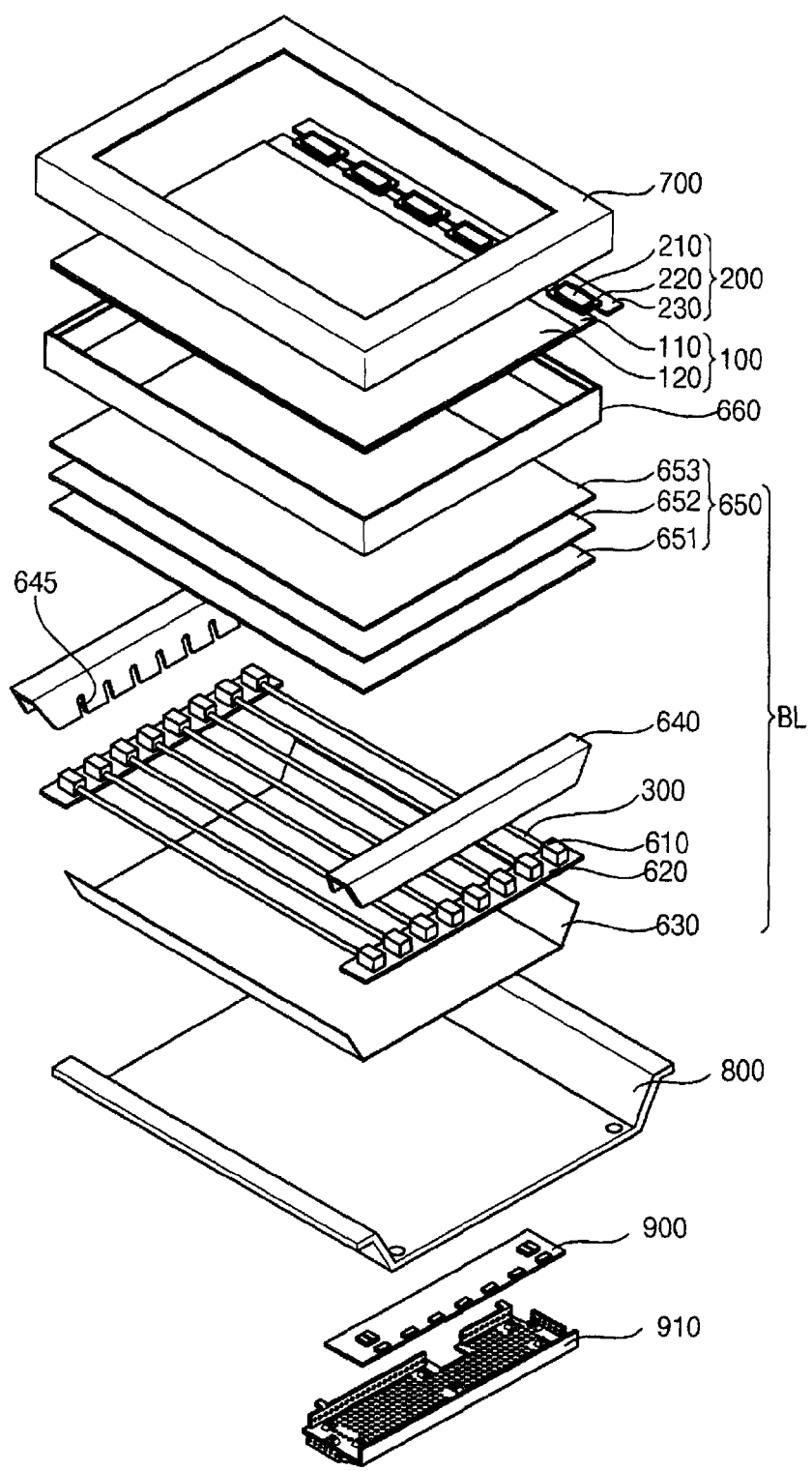
FIG. 1 is an exploded perspective view of a liquid crystal display (LCD) apparatus according to Embodiment 1 of the present invention.

The present disclosure is described more fully hereinafter with reference to the accompanying drawings, in which example embodiments of the present disclosure are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Example Embodiment 1

FIG. 1 is an exploded perspective view of a liquid crystal display (LCD) apparatus according to Embodiment 1 of the present invention.

Referring to FIG. 1, the LCD apparatus according to the embodiment 1 includes an LCD panel 100, a panel driving part 200, a backlight assembly BL, a mold frame 660, a top chassis 700, a bottom chassis 800.

The display panel 100 displays an image by receiving light provided from the backlight assembly BL. The display panel 100 includes a first substrate 110 and a second substrate 120 combined with each other, and a liquid crystal layer (not shown) controlling a light transmittance and disposed between the first substrate 110 and the second substrate 120.

The panel driving part 200 drives the display panel 100 displaying the image. In order to display the image, the panel driving part 200 includes a driving integrated chip 210 mounted on a signal transmission substrate 220, and a driving circuit substrate 230 providing power and signals to the display panel 100 through the signal transmission substrate 220.

The backlight assembly BL is disposed below the display panel 100 to provide light to the display panel 100. In order to provide light, the backlight assembly BL includes a lamp 300, a lamp socket 610, a reflective member 630, an optical sheet 650, the mold frame 660 and a side mold 640.

The lamp 300 generates light to provide the light to the display panel 100.

The lamp sockets 610 disposed at both ends of the lamp 300 secure the lamp 300, and provide power to the lamp 300. Additionally, the lamp 300 is grounded through the lamp socket 610. The lamp socket 610 may be received in a socket housing 620.

The reflective member 630 is disposed below the lamp 300 and reduces light loss by upwardly reflecting light emitted downward from the lamp 300. For reflecting light, the reflective member 630 may include a plate or a sheet having high reflectivity.

The optical sheet 650 includes a diffusion sheet 651, a prism sheet 652, and a protective sheet 653. The diffusion sheet 651 diffuses the light emitted from the lamp 300 to be uniformly incident to the display panel 100. The prism sheet 652 concentrates the light diffused by the diffusion sheet 651 to be vertically incident into the display panel 100. The protective sheet 653 protects the prism sheet 652 from damage such as a scratch. For example, two or three of the optical sheet 650 may be selectively used based on desired characteristics of a display apparatus.

A lamp groove 645 is formed at the side mold 640 to secure the lamp 300 by surrounding a lamp electrode (not shown) included in the lamp 300. Additionally, the side mold 640 has a predetermined height to support the optical sheet 650, and the lamp 300 and the optical sheet 650 are separated by the side mold 640. Here, the side mold 640 may include a stepped portion to receive the optical sheet 650.

The mold frame 660 receives the display panel 100, and protects the display panel 100, the lamp 300, the lamp socket 610, the reflective member 630 and the optical sheet 650 from external impacts. For the protection, the mold frame 660 may include injection molding material such as plastic.

The top chassis 700 is disposed on an upper portion of the display panel 100, and protects the display panel 100 and the backlight assembly BL from external impacts. The top chassis 700 surrounds an external edge of the display panel 100 such that a center portion of the top chassis 700 corresponding to the display area of the display panel 100 is opened to expose the display area.

The bottom chassis 800 disposed below the backlight assembly BL receives the backlight assembly BL. The LCD apparatus according to Embodiment 1 of the present invention further includes an inverter 900 to provide power to the lamp 300, and a protective cover 910 to protect the inverter 900 and the lamp socket 610. The inverter 900 is disposed under the bottom chassis 800, and the inverter 900 is connected to the lamp socket 610 to provide the power to the lamp socket 610. The protective cover 910 is combined with a rear surface of the bottom chassis 800 to protect the inverter 900 connected to the lamp socket 610 from external impacts. For example, the protective cover 910 may include a plastic material to electrically and physically protect the inverter 900.

Figure 2:
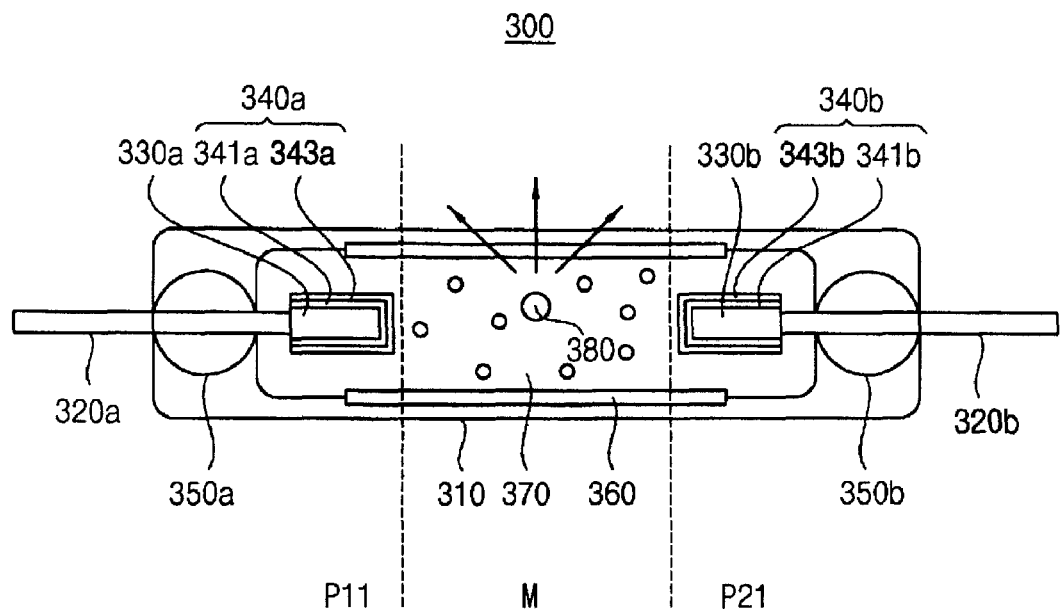
FIG. 2 is a cross-sectional view of a lamp in the LCD apparatus illustrated in FIG. 1 according to an embodiment.

FIG. 2 is a cross-sectional view of the lamp 300 in the LCD apparatus illustrated in FIG. 1 according to an embodiment.

Referring to FIGS. 1 and 2, the lamp 300 includes a tube 310 which forms a light-emitting space 370, a first electrode P11 and a second electrode P21. A middle region M represents a region between the first and second electrodes P11 and P21.

The light-emitting space 370 of the tube 310 is filled with a mixed gas 380 of mercury, argon, neon, etc. A fluorescent layer 360 is formed on an inner surface of the tube 310, and alumina may be included in the fluorescent layer 360 for starting improvement. The first and second electrodes P11 and P21 may be formed at both ends of the tube 310.

Electrons start to be emitted from the first and second electrodes P11 and P21 by an electric field when a voltage is provided to the first and second electrodes P11 and P21. Since the electron emission is performed by the electric field, heat is not required for the electron emission. When the electrons start to be emitted, mercury located in the light-emitting space 370 is excited to emit ultraviolet rays, and the fluorescent layer 360 converts the ultraviolet rays into visible rays.

Particularly, the first and second electrodes P11 and P21 attract the electrons or positive ions in the tube 310 at high speed when the voltage is provided to the first and second electrodes P11 and P21. A discharge is started by second electrons generated when the attracted electrons or the attracted positive ions collide with surfaces of the first and second electrodes P11 and P21. The electrons generated from the first and second electrodes P11 and P21 collide with the mercury. Then, the ultraviolet rays are emitted by the collision, and the fluorescent layer 360 converts the ultraviolet rays into visible rays.

The first electrode P11 includes a first lamp lead 320a, a first electrode body 330a, a first emitter surface metal layer 340a and a first bead glass 350a.

The first lamp lead 320a is connected to the lamp socket 610 to receive the voltage from the inverter 900.

The first electrode body 330a includes a metal material having high conductivity. For example, the first electrode body 330a may include nickel (Ni), molybdenum (Mo), niobium (Nb), tungsten (W), titanium (Ti), tantalum (Ta), iron (Fe), etc.

The first emitter surface metal layer 340a includes a first emitter metal layer 341a and a first surface metal layer 343a.

The first emitter metal layer 341a includes a metal oxide having a high electron emission efficiency. For example, the metal oxide may include an alkali metal oxide and/or an alkaline earth metal oxide. The first emitter metal layer 341a may include beryllium oxide (BeO), magnesium oxide (MgO), calcium oxide (CaO), strontium oxide (SrO), barium oxide (BaO), cesium oxide (CsO), radium oxide (RaO), etc. Specifically, the first emitter metal layer 341a includes an electron-emissive material. Therefore, the discharge in the emitting space 370 may be activated because the second electrodes are emitted from the first electrode P11 when the voltage is applied to the first electrode P11. Accordingly, a discharge starting voltage may be reduced, and a light-emitting efficiency may be enhanced. Additionally, the stability of the lamp 300 may be enhanced by reducing heat generated when the LCD apparatus operates.

The first surface metal layer 343a includes a metal material capable of improving dark start characteristics. The first surface metal layer 343a may include cesium (Cs). Specifically, cesium (Cs) is an electron-emissive material having a high secondary electron emission coefficient. Therefore, the discharge is performed well by the second electrons from the first surface metal layer 343a, and the dark start characteristics may be improved.

The first bead glass 350a is formed to cover the first lamp lead 320a. The first bead glass 350a protects the tube 310 from impacts caused by an expansion or a contraction of the first lamp lead 320a.

The second electrode P21 includes a second lamp lead 320b, a second electrode body 330b, a second emitter surface metal layer 340b, and a second bead glass 350b.

The second lamp lead 320b is connected to the lamp socket 610 to be grounded. The second lamp lead 320b may be connected to the inverter 900 to receive the voltage from the inverter 900.

The second electrode body 330b includes a metal material having high conductivity. The second electrode body 330b may include nickel (Ni), molybdenum (Mo), niobium (Nb), tungsten (W), titanium (Ti), tantalum (Ta) or iron (Fe).

The second emitter surface metal layer 340b includes a second emitter metal layer 341b and a second surface metal layer 343b.

The second emitter metal layer 341b includes a metal material of an oxide having a high electron emission efficiency. Here, the metal oxide may include an alkali metal oxide and/or an alkaline earth metal oxide. The second emitter metal layer 341b may include beryllium oxide (BeO), magnesium oxide (MgO), calcium oxide (CaO), strontium oxide (SrO), barium oxide (BaO), cesium oxide (CsO), radium oxide (RaO), etc. Specifically, the second emitter metal layer 341b includes an electron-emissive material having a secondary emission coefficient. Therefore, the discharge in the emitting space 370 may be activated because the second electrodes are emitted from the second electrode P21 when the voltage is applied to the second electrode P21. Accordingly, a discharge starting voltage is reduced and a light-emitting efficiency may be enhanced. Additionally, the stability of the lamp 300 may be enhanced by reducing heat generated when the LCD apparatus operates.

The second surface metal layer 343b includes a metal material capable of improving dark start characteristics of the lamp 300. The second surface metal layer 343b may include cesium (Cs). Specifically, cesium (Cs) is an electron-emissive material having a high secondary electron emission coefficient. Therefore, the discharge is performed well by the second electrons from the second surface metal layer 343b, and the dark start characteristics may be improved.

The second bead glass 350b is formed to cover the second lamp lead 320b. The second bead glass 350b protects the tube 310 from impacts caused by an expansion or a contraction of the second lamp lead 320b.

Figure 3:
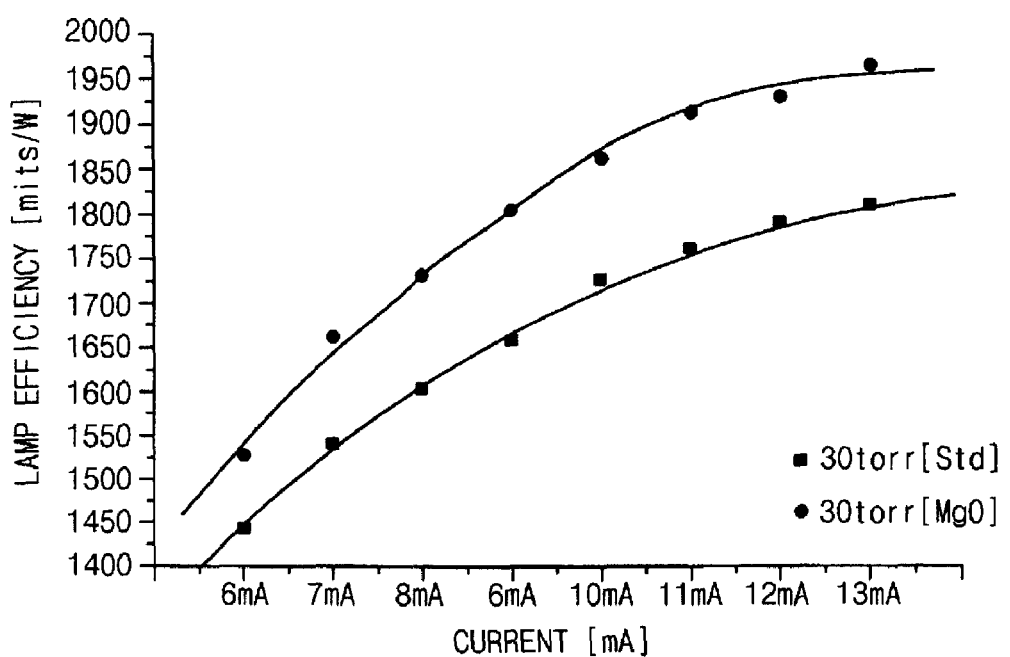
FIG. 3 is a graph for comparing lamp efficiency according to current flowing through a lamp in the embodiment of FIG. 2 with lamp efficiency according to current flowing through a conventional lamp.

FIG. 3 is a graph for comparing lamp efficiency according to current flowing through the lamp in the embodiment of FIG. 2 with lamp efficiency according to current flowing through a conventional lamp.

Table 1 is for comparing the lamp efficiency according to current flowing through the lamp in the embodiment of FIG. 2 with the lamp efficiency according to current flowing through the conventional lamp.

TABLE 1

| | | 6 mA | 7 mA | 8 mA | 9 mA | 10 mA | 11 mA | 12 mA | 13 mA |
|---|---|---|---|---|---|---|---|---|---|
| 30 torr (Ar 10%) CL | VOLTAGE (V) | 1,358.5 | 1,380.8 | 1,360.4 | 1,336.2 | 1,317.8 | 1,298.6 | 1,276.4 | 1,254.4 |
| | LUMINANCE (nit) | 11,798.8 | 14,717.8 | 17,366.2 | 19,999.2 | 22,790.8 | 25,172.2 | 27,467.8 | 29,555.8 |
| | LUMINANCE (%) | 100 | 100 | 100 | 100 | 100 | 100 | 100 | 100 |
| | X | 0.2429 | 0.2437 | 0.2441 | 0.2443 | 0.2447 | 0.2450 | 0.2453 | 0.2456 |

TABLE 1-continued

| | | 6 mA | 7 mA | 8 mA | 9 mA | 10 mA | 11 mA | 12 mA | 13 mA |
|---|---|---|---|---|---|---|---|---|---|
| | Y | 0.2071 | 0.2084 | 0.2091 | 0.2096 | 0.2104 | 0.2111 | 0.2117 | 0.2123 |
| | POWER CONSUMPTION (W) | 8.2 | 9.6 | 10.8 | 12.1 | 13.2 | 14.3 | 15.3 | 16.3 |
| | POWER CONSUMPTION (%) | 100 | 100 | 100 | 100 | 100 | 100 | 100 | 100 |
| | LAMP EFFICIENCY (nits/W) | 1443 | 1541 | 1603 | 1659 | 1726 | 1761 | 1790 | 1810 |
| | LAMP EFFICIENCY (%) | 100 | 100 | 100 | 100 | 100 | 100 | 100 | 100 |
| 30 torr (Ar 10%) ML | VOLTAGE (V) | 1,280.5 | 1,267.167 | 1,250.167 | 1,234.833 | 1,215.341 | 1,195.667 | 1,174.5 | 1,151.833 |
| | LUMINANCE (nits) | 11,789 | 11,789 | 17,357.33 | 20,099.67 | 22,693.17 | 25,176.17 | 27,252.67 | 29,470.83 |
| | LUMINANCE (%) | 100 | 101 | 100 | 101 | 100 | 100 | 99 | 100 |
| | X | 0.2427 | 0.2436 | 0.2439 | 0.2443 | 0.2446 | 0.2449 | 0.2451 | 0.2455 |
| | Y | 0.2068 | 0.2082 | 0.2087 | 0.2093 | 0.2100 | 0.2107 | 0.2113 | 0.2121 |
| | POWER CONSUMPTION (W) | 7.7 | 8.9 | 10.0 | 11.1 | 12.2 | 13.2 | 14.1 | 15.0 |
| | POWER CONSUMPTION (%) | 94 | 93 | 93 | 92 | 91 | 92 | 92 | 92 |
| | LAMP EFFICIENCY (nits/W) | 1,529 | 1,663 | 1,731 | 1,805 | 1,864 | 1,912 | 1,930 | 1,965 |
| | LAMP EFFICIENCY (%) | 106 | 108 | 108 | 109 | 108 | 109 | 108 | 109 |

Referring to FIGS. 2, 3 and Table 1, the lamp efficiency of the conventional lamp CL may be calculated from the voltage and the luminance corresponding to the current flowing through the conventional lamp CL after the conventional lamp CL is turned on. Here, as an example, a starting voltage for the conventional lamp CL may be about 1,554.25 V.

Additionally, according to the Embodiment 1, the lamp efficiency of the lamp 300 having the first and second emitter surface metal layers 340a and 340b may be calculated from the voltage and the luminance corresponding to the current flowing through the lamp 300. Particularly, the first and second emitter surface metal layers 340a and 340b according to an embodiment includes magnesium oxide (MgO). Additionally, a starting voltage for the lamp 300 including magnesium oxide (MgO) may be about 1474.5 V, for example.

Therefore, it can be noted that the starting voltage for the conventional lamp CL may be higher than the starting voltage for the lamp 300.

The voltage required for turning on the conventional lamp CL may be higher than the voltage required for turning on the lamp 300.

For example, when about 6 mA is flowing through the conventional lamp CL, the voltage across both ends of the conventional lamp CL and the power consumption of the conventional lamp CL may respectively be about 1358.5 V and about 8.2 W. Additionally, the luminance of the conventional lamp CL may be about 11,798.8 nits. Accordingly, the lamp efficiency of the conventional lamp CL may be about 1,443 nits/W.

In contrast, when about 6 mA is flowing through the conventional lamp CL, the voltage across both ends of the lamp 300 and the power consumption of the lamp 300 may respectively be about 1280.5 V and about 7.7 W. Additionally, the luminance of the lamp 300 may be about 11,789 nits. Accordingly, the lamp efficiency of the lamp 300 may be about 1,529 nits/W.

Specifically, in percentage terms, the voltage across both ends of the lamp 300 and the power consumption for the lamp 300 are about 94% and about 100% when the voltage across both ends of the conventional lamp CL and the power consumption for the conventional lamp CL are about 100% and about 100%. Additionally, the lamp efficiency of the lamp 300 is about 106% when the lamp efficiency of the conventional lamp CL is about 100%.

Therefore, the power consumption for the conventional lamp CL is more than the power consumption for the lamp 300 when the conventional lamp CL and the lamp 300 have substantially the same luminance. Therefore, the lamp efficiency of the lamp 300 is higher than the lamp efficiency of the conventional lamp CL.

When, for example, about 8 mA is flowing through the conventional lamp CL, the voltage across both ends of the conventional lamp CL and the power consumption of the conventional lamp CL may respectively be about 1360.4 V and about 10.8 W. Additionally, the luminance of the conventional lamp CL may be about 17,366.2 nits. Accordingly, the lamp efficiency of the conventional lamp CL may be about 1,603 nits/W.

In contrast, when about 8 mA is flowing through the conventional lamp CL, the voltage across both ends of the lamp 300 and the power consumption of the lamp 300 may respectively be about 1250.16 V and about 10.0 W. Additionally, the luminance of the lamp 300 may be about 17,357.33 nits. Accordingly, the lamp efficiency of the lamp 300 may be about 1,731 nits/W.

Specifically, in percentage terms, the voltage across both ends of the lamp 300 and the power consumption for the lamp 300 are about 93% and about 100% when the voltage across both ends of the conventional lamp CL and the power consumption for the conventional lamp CL are about 100% and about 100%. Additionally, the lamp efficiency of the lamp 300 is about 108% when the lamp efficiency of the conventional lamp CL is about 100%.

Therefore, the power consumption for the conventional lamp CL is more than the power consumption for the lamp 300 when the conventional lamp CL and the lamp 300 have substantially the same luminance. Therefore, the lamp efficiency of the lamp 300 is higher than the lamp efficiency of the conventional lamp CL.

When, for example, about 10 mA is flowing through the conventional lamp CL, the voltage across both ends of the conventional lamp CL and the power consumption of the conventional lamp CL may respectively be about 1,317.8 V and about 13.2 W. Additionally, the luminance of the conventional lamp CL may be about 22,790.8 nits. Accordingly, the lamp efficiency of the conventional lamp CL may be about 1,726 nits/W.

In contrast, when about 10 mA is flowing through the conventional lamp CL, the voltage across both ends of the lamp 300 and the power consumption of the lamp 300 may respectively be about 1,215.341 V and about 12.2 W. Additionally, the luminance of the lamp 300 may be about 22,693.17 nits. Accordingly, the lamp efficiency of the lamp 300 may be about 1,864 nits/W.

Specifically, in percentage terms, the voltage across both ends of the lamp 300 and the power consumption for the lamp 300 are about 93% and about 100% when the voltage across both ends of the conventional lamp CL and the power consumption for the conventional lamp CL are about 100% and about 100%. Additionally, the lamp efficiency of the lamp 300 is about 108% when the lamp efficiency of the conventional lamp CL is about 100%.

Therefore, the power consumption for the conventional lamp CL is more than the power consumption for the lamp 300 when the conventional lamp CL and the lamp 300 have substantially the same luminance. Therefore, the lamp efficiency of the lamp 300 is higher than the lamp efficiency of the conventional lamp CL.

When, for example, 12 mA is flowing through the conventional lamp CL, the voltage across both ends of the conventional lamp CL and the power consumption of the conventional lamp CL may respectively be about 1276.4 V and about 15.3 W. Additionally, the luminance of the conventional lamp CL may be about 27,467.8 nits. Accordingly, the lamp efficiency of the conventional lamp CL may be about 1,790 nits/W.

In contrast, when about 12 mA is flowing through the conventional lamp CL, the voltage across both ends of the lamp 300 and the power consumption of the lamp 300 may respectively be about 1174.5 V and about 14.1 W. Additionally, the luminance of the lamp 300 may be about 27,252.67 nits. Accordingly, the lamp efficiency of the lamp 300 may be about 1,930 nits/W.

Specifically, in percentage terms, the voltage across both ends of the lamp 300 and the power consumption for the lamp 300 are about 92% and about 100% when the voltage across both ends of the conventional lamp CL and the power consumption for the conventional lamp CL are about 100% and about 100%. Additionally, the lamp efficiency of the lamp 300 is about 108% when the lamp efficiency of the conventional lamp CL is about 100%.

Therefore, the power consumption for the conventional lamp CL is more than the power consumption for the lamp 300 when the conventional lamp CL and the lamp 300 have substantially the same luminance. Therefore, the lamp efficiency of the lamp 300 is higher than the lamp efficiency of the conventional lamp CL.

Referring to FIG. 3 again, a difference between the lamp efficiencies of the conventional lamp CL and the lamp 300 may be substantially from about 7% to about 9%.

Figure 4:
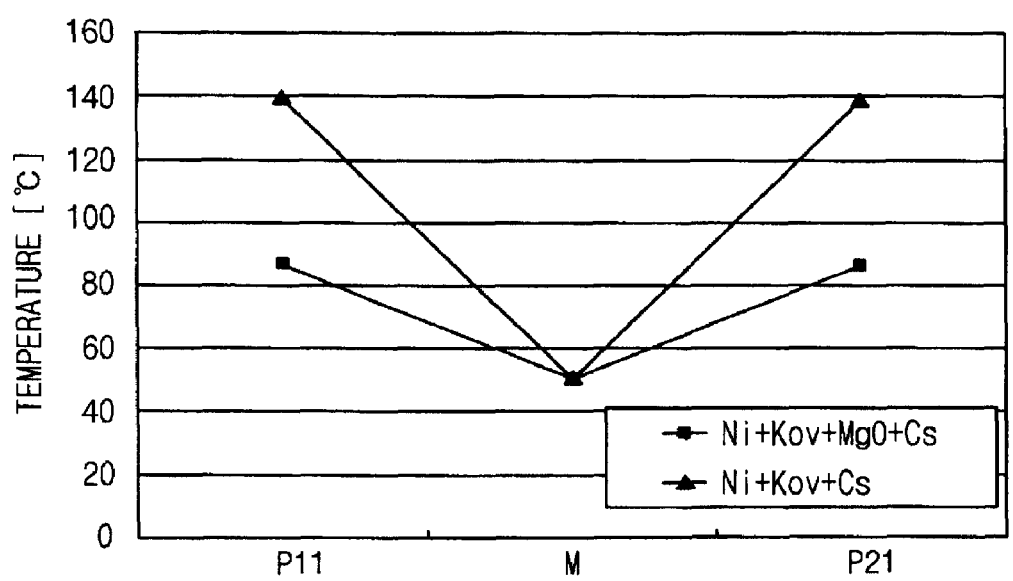
FIG. 4 is a graph representing temperatures measured at first electrodes, middle portions and second electrodes of a conventional lamp and a lamp in the embodiment of FIG. 2.

FIG. 4 is a graph representing temperatures measured at first electrodes, middle portions and second electrodes of the conventional lamp CL and the lamp 300 in the embodiment of FIG. 2.

Referring to FIGS. 2 and 4, the temperatures at the first electrode P11 and the second electrode P21 of the lamp 300 are higher than the middle M of the lamp 300.

More power consumption for the conventional lamp CL is required than the power consumption for the lamp 300 so that the conventional lamp CL and the lamp 300 may have substantially the same luminance as that described with reference to FIG. 3. Therefore, the temperature at the first electrode P11 of the conventional lamp CL and the temperature at the second electrode P21 of the conventional lamp CL are respectively over 40° C. higher than the first electrode P11 of the lamp 300 and the second electrode P21 of the lamp 300.

Accordingly, the lamp 300 may be more reliable by reducing heat which reduces efficiency of the lamp 300.

Figure 5:
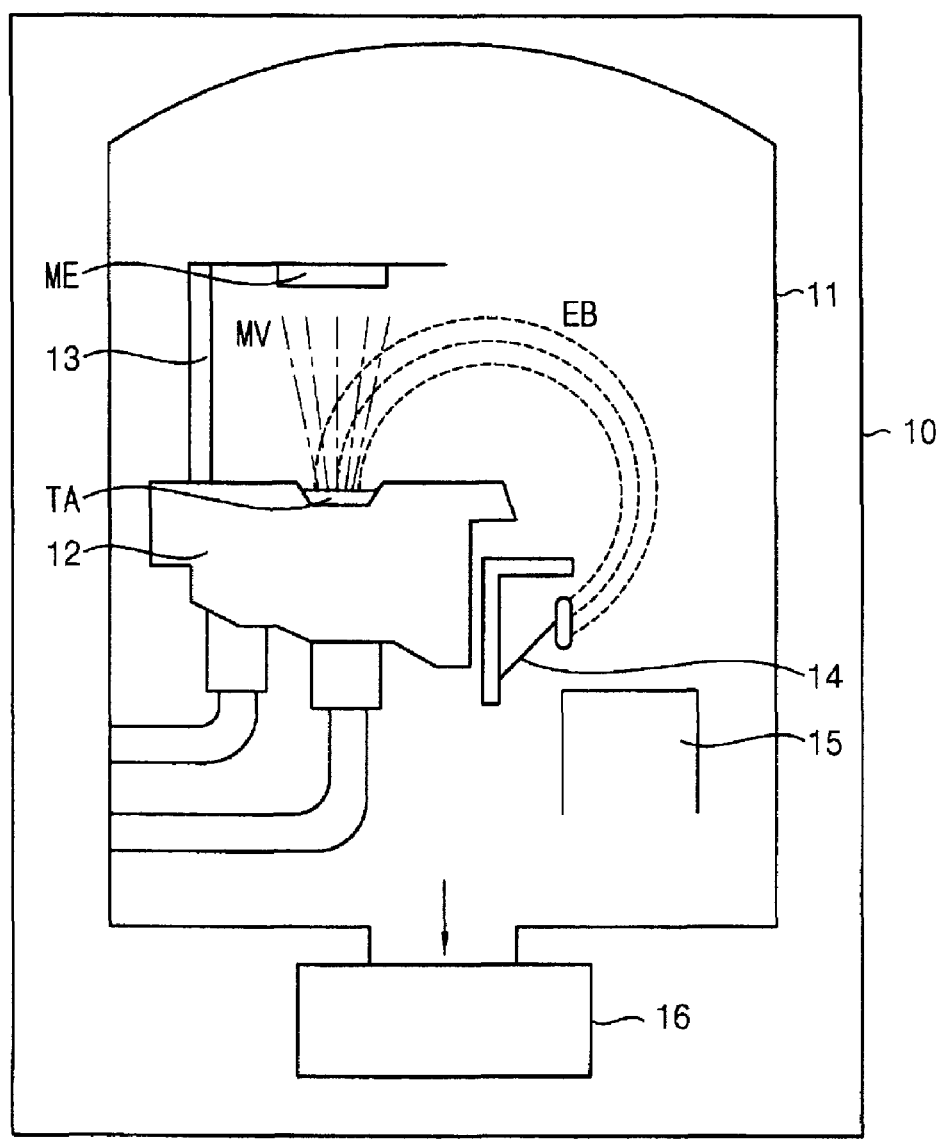
FIG. 5 is a cross-sectional view of an electron-beam evaporator which may be used when a lamp of FIG. 2 is manufactured according to an embodiment.

FIG. 5 is a cross-sectional view of an electron-beam evaporator used for manufacturing the lamp of FIG. 2 according to an embodiment.

Referring to FIGS. 2 and 5, the electron-beam evaporator 10 includes a vacuum chamber 11. The vacuum chamber 11 is vacuumed by a vacuum pump 16. The vacuum chamber 11 includes a metal object ME which is coated, a supporter 12 securing the metal object, and a target material TA disposed opposite to the metal object. Here, a distance between the metal object ME and the target material TA is changeable and may be set depending on an area of the metal object ME, a size of the vacuum chamber and a deposition rate of the target material TA.

A tungsten filament TF and a permanent magnet 13 are disposed to surround the target material TA. The tungsten filament TF radiates an electron when heated, and the electron is deflected by a magnetic field by the permanent magnet 13 to become a deflected electron EB, and a target material TA is melted and evaporated by the deflected electron EB.

Since the target material TA is evaporated to become an evaporated target material MV, the evaporated target material MV does not include water. Therefore, a light flickering defect of the lamp caused by reaction between water molecules and a metal oxide may be prevented.

The evaporated target material MV is coated on the metal object ME.

In Embodiment 1, the target material TA may include beryllium oxide (BeO), magnesium oxide (MgO), calcium oxide (CaO), strontium oxide (SrO), barium oxide (BaO), cesium oxide (CsO), radium oxide (RaO), etc. Additionally, the target material TA may include cesium (Cs).

Table 2 shows a comparison between starting time of the lamp 300 including cesium (Cs) and starting time of the conventional lamp CL which does not include cesium (Cs). Here, the dark start may be improved by the lamp including cesium (Cs).

TABLE 2

|  | With Cs | Without Cs |
| --- | --- | --- |
| #1 | 25 ms | 1,400 ms |
| #2 | 20 ms | 1,120 ms |
| #3 | 14 ms | 1,650 ms |
| #4 | 14 ms | 890 ms |
| #5 | 14 ms | 2,150 ms |
| #6 | 13 ms | 1,890 ms |
| #7 | 15 ms | 1,760 ms |
| #8 | 13 ms | 1,480 ms |
| #9 | 13 ms | 800 ms |
| #10 | 16 ms | 1,990 ms |
| #11 | 16 ms | 2,450 ms |
| #12 | 13 ms | 2,960 ms |
| #13 | 22 ms | 1,000 ms |
| #14 | 17 ms | 1,560 ms |
| #15 | 19 ms | 1,810 ms |

Referring to FIG. 2 and Table 2, the lamp 300 including cesium (Cs) according to an embodiment is turned on about 10 ms through 25 ms after the lamp 300 is turned on. In contrast, the conventional lamp CL is turned on about 800 ms through 3,000 ms after the conventional lamp CL is turned on.

Accordingly, it should be noted that according to this embodiment the dark start may be improved because the first and second electrodes P11 and P21 of the lamp 300 include cesium (Cs).

Figure 6A:
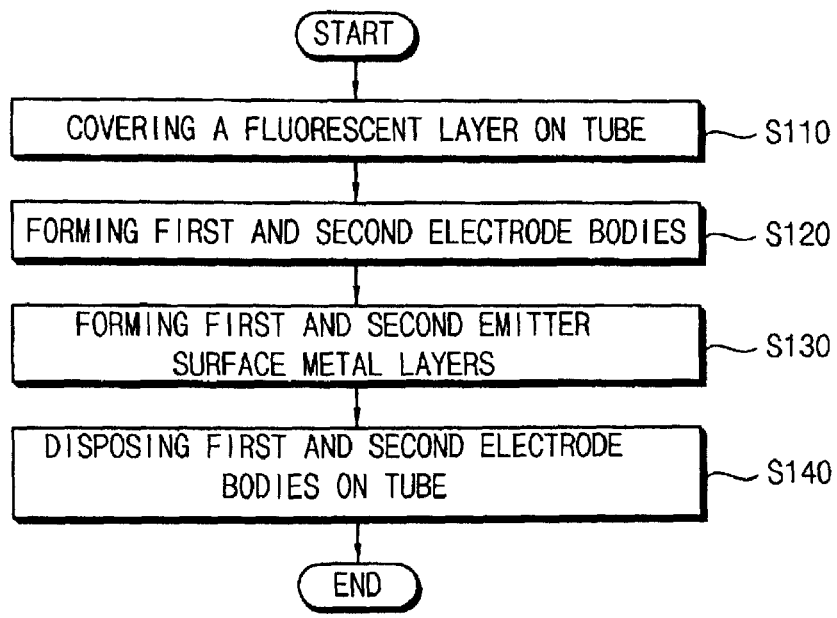
FIGS. 6A and 6B are flowchart diagrams illustrating a method of manufacturing a lamp of FIG. 2 according to one or more embodiments.
Figure 6B:
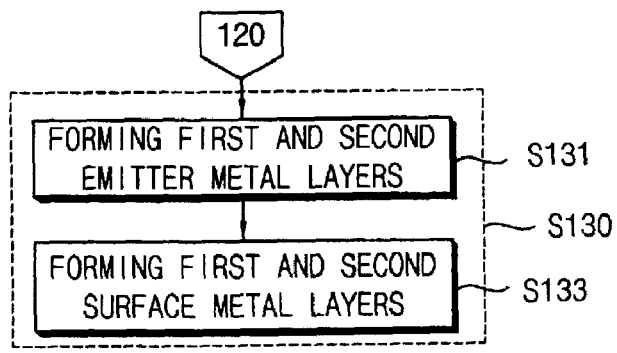
Figure 6C:
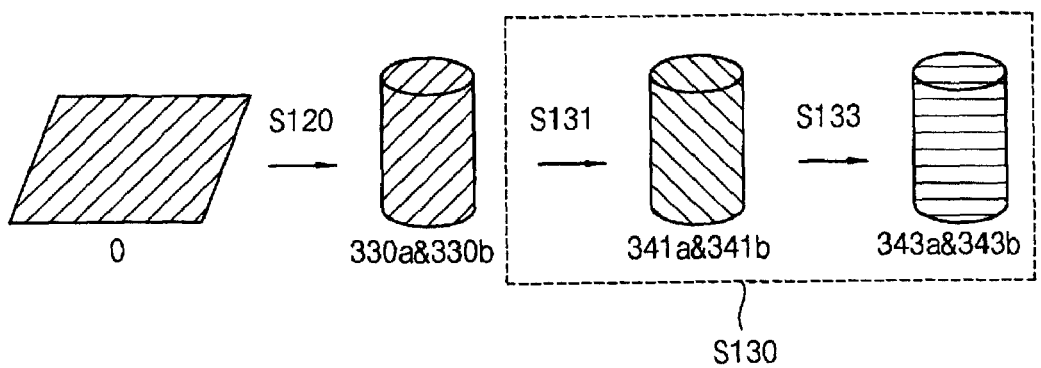
FIG. 6C is an exploded perspective view of first and second electrodes for illustrating a method of manufacturing a lamp of FIG. 2 according to an embodiment.

FIGS. 6A and 6B are flowchart diagrams illustrating a method of manufacturing the lamp of FIG. 2 according to one or more embodiments. FIG. 6C is an exploded perspective view of the first and second electrodes for illustrating the method of manufacturing the lamp of FIG. 2 according to an embodiment.

Referring to FIGS. 2, 6A through 6C, the fluorescent layer 360 is coated on the tube 310 to have a proper thickness, and then heated for drying (block S110). Then, the first and second electrode bodies 330a and 330b respectively included in the first and second electrodes P11 and P21 are formed (block S120). The first and second electrode bodies 330a and 330b include a metal material having high conductivity. For example, the first and second electrode bodies 330a and 330b may be manufactured by press processing a plate O into a cup shape. Examples of a material that may be used for the first and second electrode bodies 330a and 330b may include nickel (Ni), molybdenum (Mo), niobium (Nb), tungsten (W), titanium (Ti), tantalum (Ta), iron (Fe), etc.

The first and second emitter surface metal layers 230a and 230b respectively included in the first and second electrodes P11 and P21 are formed after forming the cup-shaped first and second electrode bodies 330a and 330b (block S130). Block S130 includes forming the first and second emitter metal layers 341a and 341b (block 5131) and forming the first and second surface metal layers 343a and 343b (block S133).

At block S131, the target material TA may be evaporated by the electron-beam evaporator 10 of FIG. 5 to form the first and second emitter metal layers 341a and 341b coated on the first and second electrode bodies 330a and 330b. Since the target material TA is evaporated, the target material TA does not include water. For example, the target material TA may include beryllium oxide (BeO), magnesium oxide (MgO), calcium oxide (CaO), strontium oxide (SrO), barium oxide (BaO), cesium oxide (CsO), radium oxide (RaO), etc.

At block S133, the target material TA may be evaporated by the electron-beam evaporator 10 to form the first and second emitter metal layers 341a and 341b coated on the first and second surface metal layers 343a and 343b. Since the target material TA is evaporated, the target material TA does not include water. For example, the target material TA may include cesium (Cs).

The first and second electrode bodies 330a and 330b, and the first and second emitter surface metal layers 340a and 340b are disposed on the tube 310 (block S140). The tube 310 is filled with the mixed gas 380 of mercury, argon, neon, etc.

Therefore, the first and second emitter metal layers 341a and 341b including a metal oxide having high electron emission efficiency, and the first and second surface metal layers 343a and 343b including a metal material capable of improving characteristics of dark start may be deposited on the first and second electrode bodies 330a and 330b. Therefore, a light flickering defect of the lamp caused by reaction between water molecules and a metal oxide may be removed.

Example Embodiment 2

Figure 7:
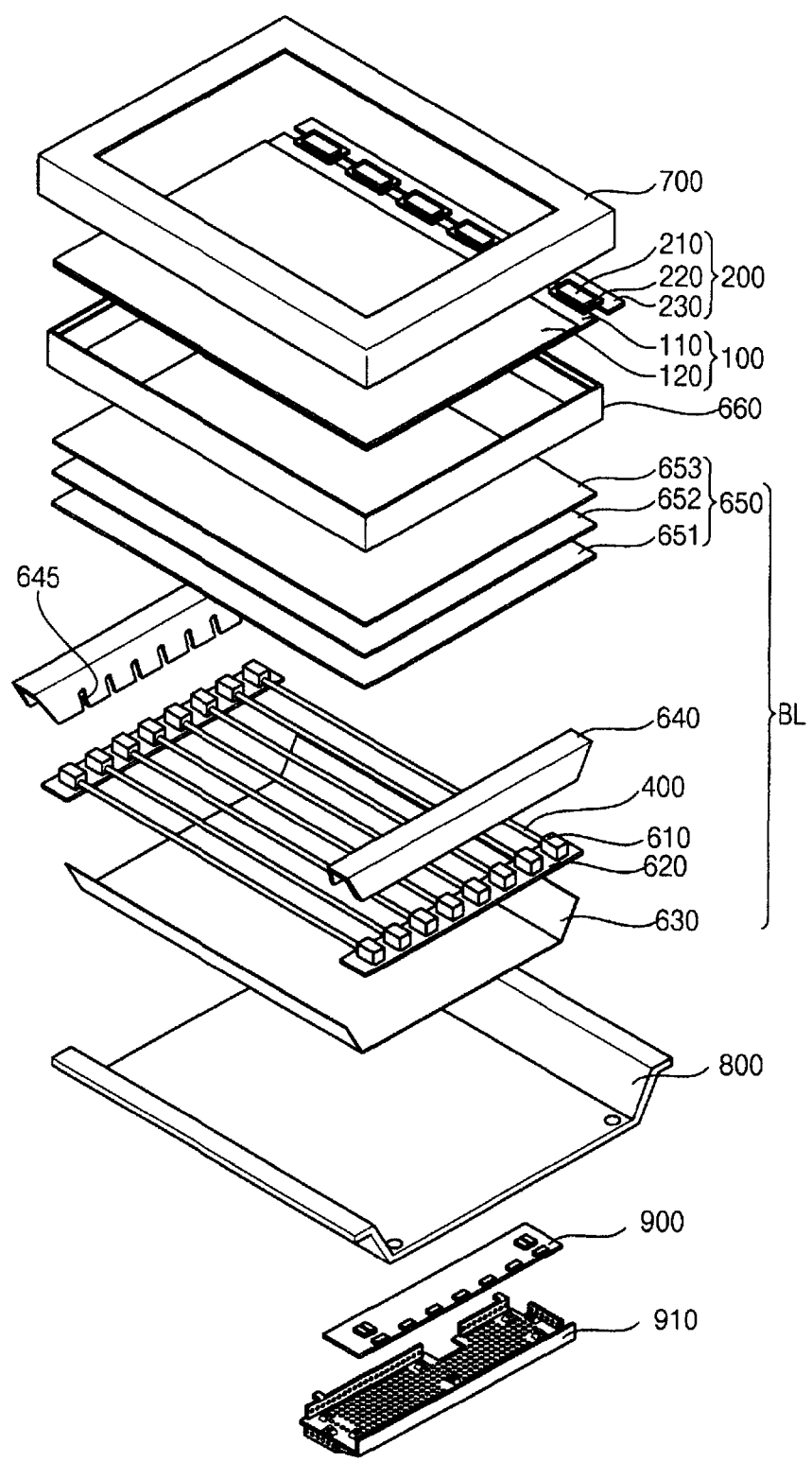
FIG. 7 is an exploded perspective view of an LCD apparatus according to Embodiment 2 of the present invention.

FIG. 7 is an exploded perspective view of an LCD apparatus according to Embodiment 2 of the present invention. In FIG. 7, the LCD apparatus is substantially the same as the LCD apparatus in FIG. 1, except for a lamp 400. Thus, the same reference numbers are used for the same elements, and repetitive descriptions are omitted.

Figure 8:
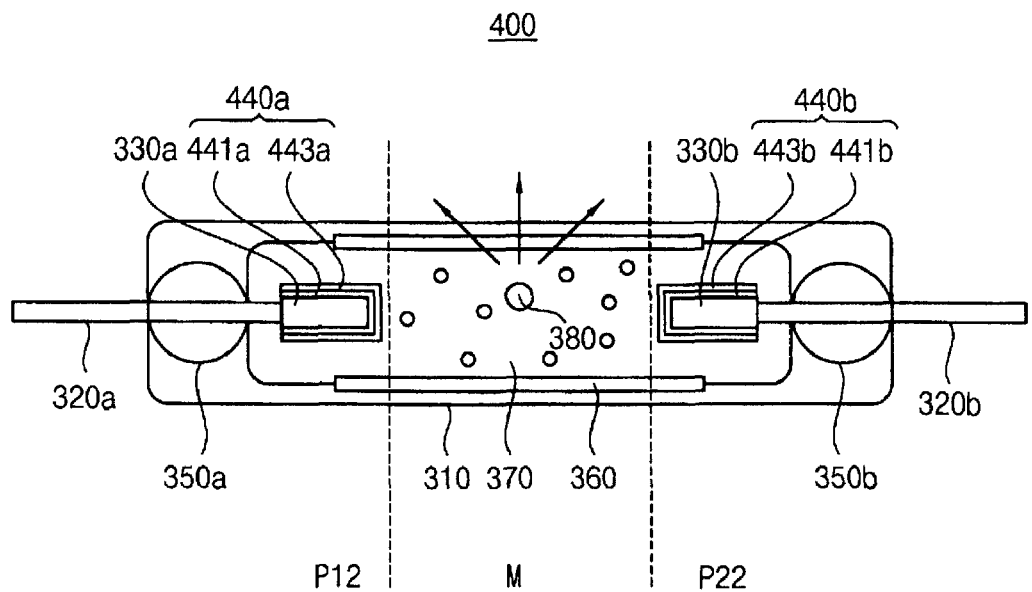
FIG. 8 is a cross-sectional view of a lamp in the LCD apparatus illustrated in FIG. 7 according an embodiment.

FIG. 8 is a cross-sectional view of the lamp 400 in the LCD apparatus illustrated in FIG. 7 according to an embodiment.

The cross-sectional view of the lamp 400 in the embodiment of FIG. 8 is substantially the same as the cross-sectional view of the lamp 300 in the embodiment of FIG. 2, except for a first emitter surface metal layer 440a and a second emitter surface metal layer 440b, thus, the same reference numbers are used for the same elements, and repetitive descriptions are omitted.

Referring to FIGS. 7 and 8, the LCD apparatus according to Embodiment 2 includes the LCD panel 100, the panel driving part 200, the backlight assembly BL, the mold frame 660, the top chassis 700 and the bottom chassis 800. The backlight assembly BL includes the lamp 400.

The lamp 400 includes the tube 310, a first electrode P12 and a second electrode P22.

The light-emitting space 370 of the tube 310 is filled with a mixed gas 380 including mercury, argon, neon, etc. A fluorescent layer 360 is formed on an inner surface of the tube 310, and alumina may be included in the fluorescent layer 360 for starting improvement. The first and second electrodes P12 and P22 may be formed at both ends of the tube 310.

Electrons start to be emitted from the first and second electrodes P12 and P22 by an electric field when a voltage is provided to the first and second electrodes P12 and P22. Since the electron emission is performed by the electric field, heat is not required for the electron emission. When the electrons start to be emitted, mercury in the light-emitting space 370 is excited to emit ultraviolet rays, and the fluorescent layer 360 converts the ultraviolet rays into visible rays.

Specifically, the first and second electrodes P12 and P22 attract the electrons or positive ions in the tube 310 at high speed when the voltage is provided to the first and second electrodes P12 and P22. A discharge is started by second electrons generated when the attracted electrons or the attracted positive ions collide with surfaces of the first and second electrodes P12 and P22. The electrons generated from the first and second electrodes P12 and P22 collide with the mercury. Then, the ultraviolet rays are emitted by the collision, and the fluorescent layer 360 converts the ultraviolet rays into visible rays.

The first electrode P12 includes the first lamp lead 320a, the first electrode body 330a, the first emitter surface metal layer 440a and the first bead glass 350a.

The first lamp lead 320a is connected to the lamp socket 610 to receive the voltage from the inverter 900.

The first electrode body 330a includes a metal material having high conductivity. The first electrode body 330a may include nickel (Ni), molybdenum (Mo), niobium (Nb), tungsten (W), titanium (Ti), tantalum (Ta), iron (Fe), etc.

The first emitter surface metal layer 440a includes a first surface metal layer 441a and a first emitter metal layer 443a.

The first surface metal layer 441a includes a metal material capable of improving dark start characteristics. The first surface metal layer 441a may include cesium (Cs). Specifically, cesium (Cs) is an electron-emissive material having a high secondary electron emission coefficient. Therefore, the discharge is performed well by the second electrons from the first surface metal layer 441a, and the dark start characteristics may be improved.

The first emitter metal layer 443a includes a metal oxide having a high electron emission efficiency. Here, the metal oxide may include an alkali metal oxide and/or an alkaline earth metal oxide. The first emitter metal layer 443a may include beryllium oxide (BeO), magnesium oxide (MgO), calcium oxide (CaO), strontium oxide (SrO), barium oxide (BaO), cesium oxide (CsO), radium oxide (RaO), etc. Specifically, the first emitter metal layer 443a includes an electron-emissive material having a secondary emission coefficient. Therefore, the discharge in the emitting space 370 may be activated because the second electrodes are emitted from the first electrode P12 when the voltage is applied to the first electrode P12. Accordingly, a discharge starting voltage is reduced and a light-emitting efficiency may be enhanced. Additionally, the stability of the lamp 300 may be enhanced by reducing heat generated when the LCD apparatus operates.

The second electrode P22 includes the second lamp lead 320b, the second electrode body 330b, the second emitter surface metal layer 440b and the second bead glass 350b.

The second lamp lead 320b is connected to the lamp socket 610 to be grounded. The second lamp lead 320b may be connected to the inverter 900 to receive the voltage from the inverter 900.

The second electrode body 330b includes a metal material having high conductivity. The second electrode body 330b may include nickel (Ni), molybdenum (Mo), niobium (Nb), tungsten (W), titanium (Ti), tantalum (Ta), iron (Fe), etc.

The second emitter surface metal layer 440b includes a second surface metal layer 441b and a second emitter metal layer 443b.

The second surface metal layer 441b includes a metal material capable of improving dark start characteristics. The second surface metal layer 441b may include cesium (Cs). Specifically, cesium (Cs) is an electron-emissive material having a high secondary electron emission coefficient. Therefore, the discharge is performed well by the second electrons from the second surface metal layer 441b, and the dark start characteristics may be improved.

The second emitter metal layer 443b includes a metal oxide having a high electron emission efficiency. Here, the metal oxide may include an alkali metal oxide and/or an alkaline earth metal oxide. The first emitter metal layer 443a may include beryllium oxide (BeO), magnesium oxide (MgO), calcium oxide (CaO), strontium oxide (SrO), barium oxide (BaO), cesium oxide (CsO), radium oxide (RaO), etc. Specifically, the second emitter metal layer 443b includes an electron-emissive material having a secondary emission coefficient. Therefore, the discharge in the emitting space 370 may be activated because the second electrodes are emitted from the second electrode P22 when the voltage is applied to the second electrode P22. Accordingly, a discharge starting voltage is reduced and a light-emitting efficiency may be enhanced. Additionally, the stability of the lamp 300 may be enhanced by reducing heat generated when the LCD apparatus operates.

Temperatures measured at the first electrodes, the middle portions and the second electrodes of the conventional lamp CL and the lamp 400 illustrated in the embodiment of FIG. 8 are substantially the same as the graph representing temperatures measured at the first electrodes, the middle portions and the second electrodes of the conventional lamp CL and the lamp 300 illustrated in the embodiment of FIG. 2, thus, the graph is omitted.

Lamp efficiency according to current flowing through the lamp in the embodiment of FIG. 8 and lamp efficiency according to current flowing through the conventional lamp are substantially the same as the lamp efficiency according to current flowing through the lamp illustrated in the embodiment of FIG. 2 and lamp efficiency according to current flowing through the conventional lamp, thus, the graph is omitted.

A cross-sectional view of an electron-beam evaporator for manufacturing the lamp of FIG. 8 is substantially the same as the cross-sectional view of an electron-beam evaporator for manufacturing the lamp of FIG. 2, thus, the cross-sectional view is omitted.

Figure 9A:
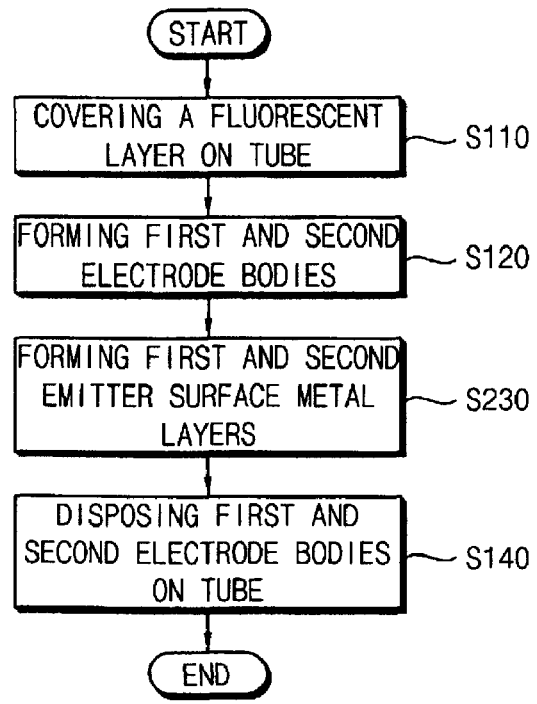
FIGS. 9A and 9B are flowchart diagrams illustrating a method of manufacturing a lamp of FIG. 8 according to one or more embodiments.
Figure 9B:
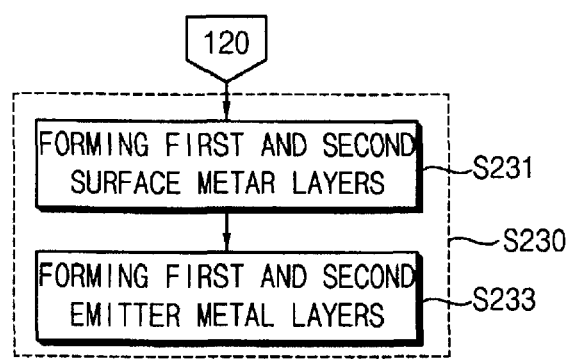
Figure 9C:
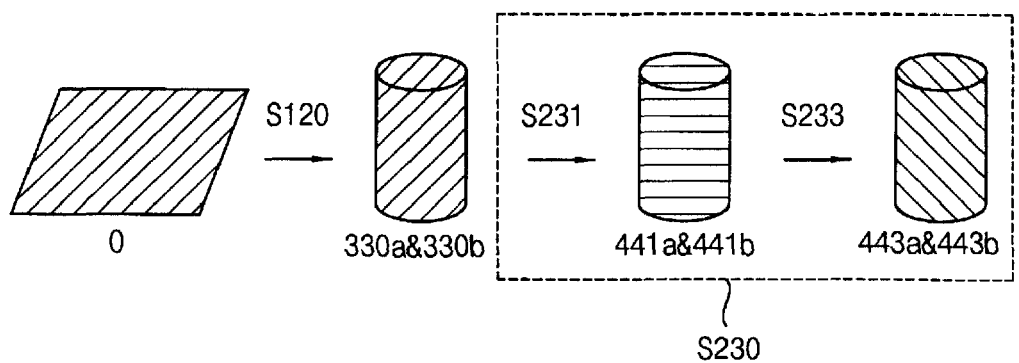
FIG. 9C is an exploded perspective view of first and second electrodes for illustrating a method of manufacturing a lamp of FIG. 8 according to an embodiment.

FIGS. 9A and 9B are flowchart diagrams illustrating a method of manufacturing the lamp of FIG. 8 according to an embodiment. FIG. 9C is an exploded perspective view of the first and second electrodes for illustrating the method of manufacturing the lamp of FIG. 8 according to an embodiment.

The method of manufacturing the lamp of FIG. 8 is substantially the same as the method of manufacturing the lamp of FIG. 2 except that the first and second emitter metal layers 443a and 443b are formed after the first and second surface metal layers 441a and 441b are formed. Thus, the same reference numbers are used for the same elements, and repetitive descriptions are omitted.

Referring to FIGS. 8 and 9A through 9C, the fluorescent layer 360 having a proper thickness is formed on the tube 310, and then heated for drying (block S110). Then, the first and second electrode bodies 330a and 330b respectively included in the first and second electrodes P12 and P22 are formed (block S120). The first and second electrode bodies 330a and 330b include a metal material having high conductivity. For example, the first and second electrode bodies 330a and 330b may be manufactured by press processing a plate O into a cup shape. Examples of a material that may be used for the first and second electrode bodies 330a and 330b may include nickel (Ni), molybdenum (Mo), niobium (Nb), tungsten (W), titanium (Ti), tantalum (Ta), iron (Fe), etc.

The first and second emitter surface metal layers 440a and 440b respectively included in the first and second electrodes P12 and P22 are formed after forming the cup-shaped first and second electrode bodies 330a and 330b (block S230). Block S230 includes forming the first and second surface metal layers 441a and 441b (block S231) and forming the first and second emitter metal layers 443a and 443b (block S233).

At block S231, the target material TA is evaporated by the electron-beam evaporator 10 to form first and second surface metal layers 441a and 441b coated on the first and second electrode bodies 330a and 330b. Since the target material TA is evaporated, the target material TA does not include water. The target material TA may include cesium (Cs).

At block S233, the target material TA is evaporated by the electron-beam evaporator 10 to form the first and second emitter metal layers 443a and 443b coated on the first and second surface metal layers 441a and 441b. Since the target material TA is evaporated, the target material TA does not include water. The target material TA may include beryllium oxide (BeO), magnesium oxide (MgO), calcium oxide (CaO), strontium oxide (SrO), barium oxide (BaO), cesium oxide (CsO), radium oxide (RaO), etc.

The first and second electrode bodies 330a and 330b, and the first and second emitter surface metal layers 440a and 440b are disposed on the tube 310 (block S140). The tube 310 is filled with the mixed gas 380 including mercury, argon, neon, etc.

Therefore, the first and second surface metal layers 441a and 441b include a metal material capable of improving dark start characteristics, and the first and second emitter metal layers 443a and 443b include a metal oxide having high electron emission efficiency and may be deposited on the first and second electrode bodies 330a and 330b. Therefore, a light flickering defect of the lamp caused by reaction between water molecules and a metal oxide may be removed.

Example Embodiment 3

Figure 10:
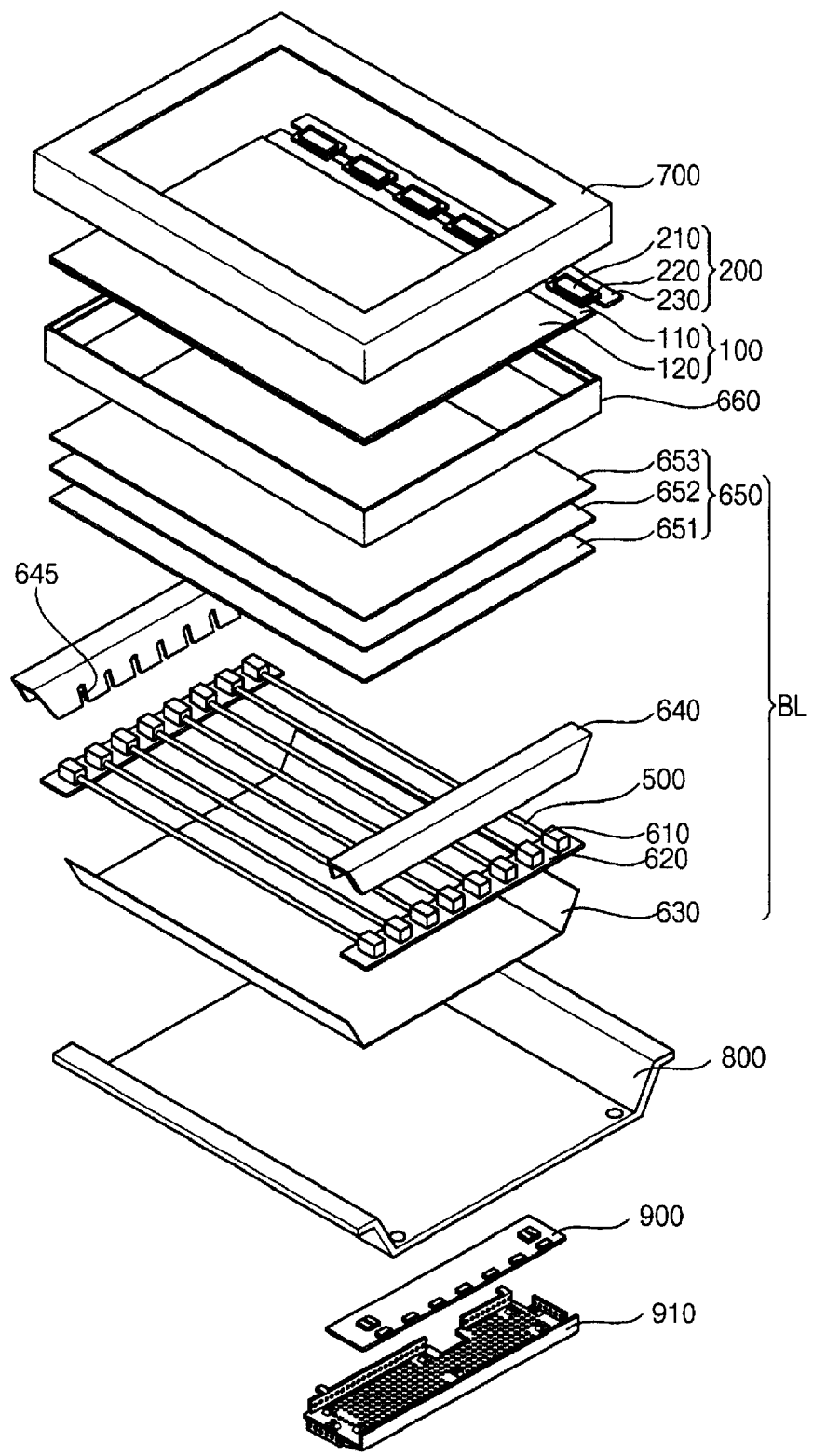
FIG. 10 is an exploded perspective view of an LCD apparatus according to Embodiment 3 of the present invention.

FIG. 10 is an exploded perspective view of an LCD apparatus according to Embodiment 3 of the present invention. In FIG. 10, the LCD apparatus is substantially the same as the LCD apparatus in FIG. 1, except for a lamp 500. Thus, the same reference numbers are used for the same elements and repetitive descriptions are omitted.

Figure 11:
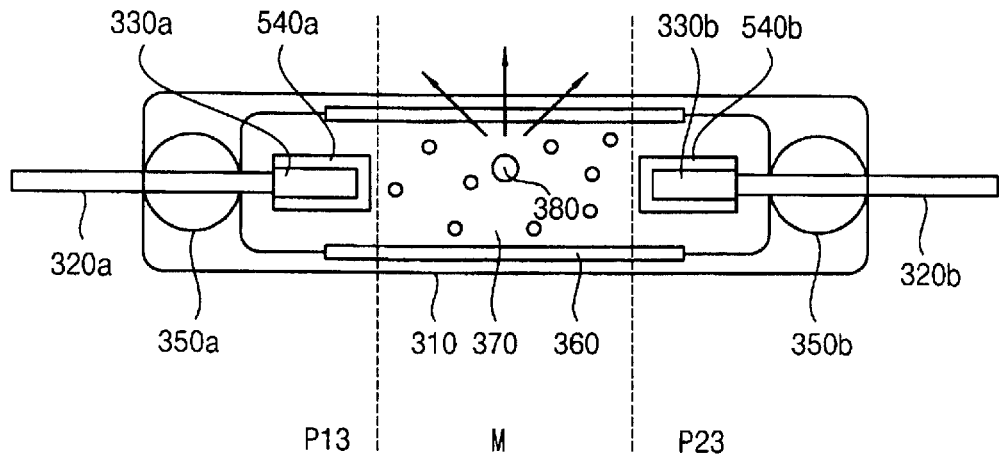
FIG. 11 is a cross-sectional view of a lamp in the LCD apparatus illustrated in FIG. 10 according to an embodiment.

FIG. 11 is a cross-sectional view of the lamp 500 in the LCD apparatus described in FIG. 10 according to an embodiment.

The cross-sectional view of the lamp 500 in the embodiment of FIG. 11 is substantially the same as the cross-sectional view of the lamp 300 in the embodiment of FIG. 2 except for a first emitter surface metal layer 540a and a second emitter surface metal layer 540b, thus, the same reference numbers are used for the same elements, and repetitive descriptions are omitted.

Referring to FIGS. 10 and 11, the LCD apparatus according to Embodiment 3 includes the LCD panel 100, the panel driving part 200, the backlight assembly BL, the mold frame 660, the top chassis 700 and the bottom chassis 800. The backlight assembly BL includes the lamp 500.

The lamp 500 includes the tube 310, a first electrode P13 and a second electrode P23.

The light-emitting space 370 of the tube 310 is filled with a mixed gas 380 including mercury, argon, neon, etc. A fluorescent layer 360 is formed on an inner surface of the tube 310, and alumina may be included in the fluorescent layer 360 for starting improvement. The first and second electrodes P13 and P23 may be formed at both ends of the tube 310.

Electrons start to be emitted from the first and second electrodes P13 and P23 when a voltage is provided to the first and second electrodes P13 and P23 by an electric field. Since the electron emission is performed by the electric field, heat is not required for the electron emission. When the electrons start to be emitted, mercury in the light-emitting space 370 is excited to emit ultraviolet rays, and the fluorescent layer 360 converts the ultraviolet rays into visible rays.

Specifically, the first and second electrodes P13 and P23 attract the electrons or positive ions in the tube 310 at high speed when the voltage is provided to the first and second electrodes P13 and P23. A discharge is started by second electrons generated when the attracted electrons or the attracted positive ions collide with surfaces of the first and second electrodes P13 and P23. The electrons generated from the first and second electrodes P13 and P23 collide with the mercury. Then, the ultraviolet rays are emitted by the collision, and the fluorescent layer 360 converts the ultraviolet rays into visible rays.

The first electrode P13 includes the first lamp lead 320a, the first electrode body 330a, the first emitter surface metal layer 540a and the first bead glass 350a.

The first lamp lead 320a is connected to the lamp socket 610 to receive the voltage from the inverter 900.

The first electrode body 330a includes a metal material having high conductivity. The first electrode body 330a may include nickel (Ni), molybdenum (Mo), niobium (Nb), tungsten (W), titanium (Ti), tantalum (Ta), iron (Fe), etc.

The first emitter surface metal layer 540a may include a metal oxide having a high electron emission efficiency. Here, the metal oxide may include an alkali metal oxide and/or an alkaline earth metal oxide. For example, the first emitter surface metal layer 540a may include beryllium oxide (BeO), magnesium oxide (MgO), calcium oxide (CaO), strontium oxide (SrO), barium oxide (BaO), cesium oxide (CsO), radium oxide (RaO), etc.

Additionally, the first emitter surface metal layer 540a may further include a metal material, for example, cesium (Cs), which is capable of improving dark start characteristics.

Specifically, cesium (Cs) is an electron-emissive material having a high secondary electron emission coefficient. Therefore, the discharge is performed well by the second electrons from the first emitter surface metal layer 540a, and the dark start characteristics may be improved.

Additionally, the discharge in the emitting space 370 may be activated because the second electrodes are emitted from the first electrode P13 when the voltage is applied to the first electrode P13. Accordingly, a discharge starting voltage is reduced and a light-emitting efficiency may be enhanced. Additionally, the stability of the lamp 500 may be enhanced by reducing heat generated when the LCD apparatus operates.

The second electrode P23 includes the second lamp lead 320b, the second electrode body 330b, the second emitter surface metal layer 540b and the second bead glass 350b.

The second lamp lead 320b is connected to the lamp socket 610 to be grounded. The second lamp lead 320b may be connected to the inverter 900 to receive the voltage from the inverter 900.

The second electrode body 330b includes a metal material having high conductivity. The second electrode body 330b may include nickel (Ni), molybdenum (Mo), niobium (Nb), tungsten (W), titanium (Ti), tantalum (Ta), iron (Fe), etc.

The second emitter surface metal layer 540b may include a metal oxide having a high electron emission efficiency. Here, the metal oxide may include an alkali metal oxide and/or an alkaline earth metal oxide. For example, the second emitter surface metal layer 540b may include beryllium oxide (BeO), magnesium oxide (MgO), calcium oxide (CaO), strontium oxide (SrO), barium oxide (BaO), cesium oxide (CsO), radium oxide (RaO), etc.

Additionally, the second emitter surface metal layer 540b may further include a metal material, for example, cesium (Cs), which is capable of improving dark start characteristics.

Specifically, cesium (Cs) is an electron-emissive material having a high secondary electron emission coefficient. Therefore, the discharge is performed well by the second electrons from the second emitter surface metal layer 540b, and the dark start characteristics may be improved.

Additionally, the discharge in the emitting space 370 may be activated because the second electrodes are emitted from the second electrode P23 when the voltage is applied to the second electrode P23. Accordingly, a discharge starting voltage is reduced and a light-emitting efficiency may be enhanced. Additionally, the stability of the lamp 500 may be enhanced by reducing heat generated when the LCD apparatus operates.

Temperatures measured at the first electrodes, the middle portions and the second electrodes of the conventional lamp CL and the lamp 500 illustrated in the embodiment of FIG. 11 are substantially the same as temperatures measured at the first electrodes, the middle portions and the second electrodes of the conventional lamp CL and the lamp 300 illustrated in the embodiment of FIG. 2, thus, the graph is omitted.

Lamp efficiency according to current flowing through the lamp in the embodiment of FIG. 11 and lamp efficiency according to current flowing through the conventional lamp are substantially the same as the lamp efficiency according to current flowing through the lamp in the embodiment of FIG.

2 and lamp efficiency according to current flowing through the conventional lamp, thus, the graph is omitted.

A cross-sectional view of an electron-beam evaporator used for manufacturing the lamp of the embodiment of FIG. 11 is substantially the same as the cross-sectional view of an electron-beam evaporator used for manufacturing the lamp of the embodiment of FIG. 2, thus, the cross-sectional view is omitted.

Figure 12A:
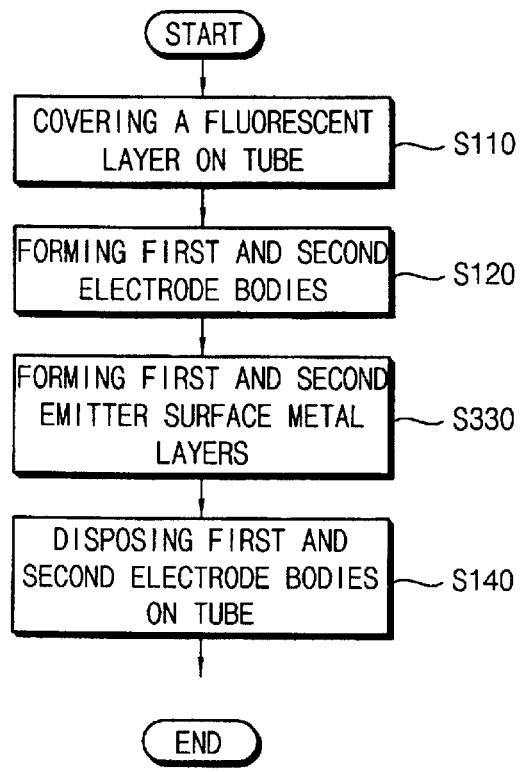
FIG. 12A is a flowchart diagram illustrating a method of manufacturing a lamp of FIG. 11 according to one or more embodiments.
Figure 12B:
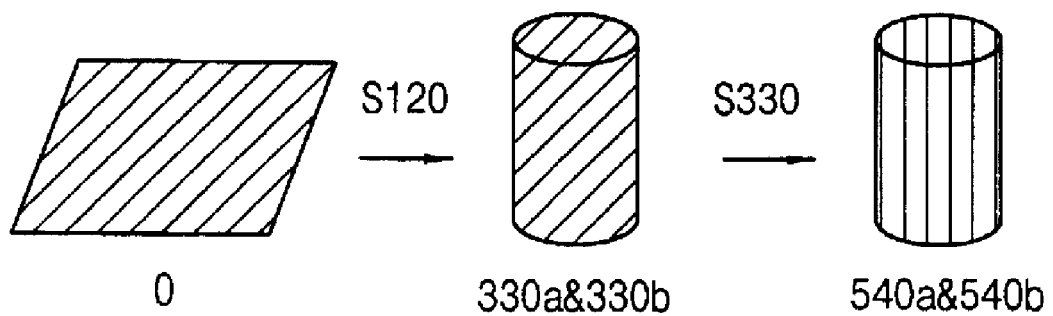
FIG. 12B is an exploded perspective view of first and second electrodes for illustrating a method of manufacturing a lamp of FIG. 11 according to an embodiment.

FIG. 12A is a flowchart diagram illustrating a method of manufacturing the lamp of FIG. 11 according to one or more embodiments. FIG. 12B is an exploded perspective view of the first and second electrodes for illustrating the method of manufacturing the lamp of FIG. 11 according to an embodiment.

The method of manufacturing the lamp of the embodiment of FIG. 11 is substantially the same as the method of manufacturing the lamp of the embodiment of FIG. 2 except that each of the first and second emitter surface metal layers 540a and 540b is formed as a single layer. Thus, the same reference numbers are used for the same elements, and repetitive descriptions are omitted.

Referring to FIGS. 11, 12A and 12B, the fluorescent layer 360 having a proper thickness is formed on the tube 310, and then heated for drying (block S110). Then, the first and second electrode bodies 330a and 330b respectively included in the first and second electrodes P13 and P23 are formed (block S120). The first and second electrode bodies 330a and 330b include a metal material having high conductivity. For example, the first and second electrode bodies 330a and 330b may be manufactured by press processing a plate O into a cup shape. Examples of a material that may be used for the first and second electrode bodies 330a and 330b may include nickel (Ni), molybdenum (Mo), niobium (Nb), tungsten (W), titanium (Ti), tantalum (Ta), iron (Fe), etc.

The first and second emitter surface metal layers 540a and 540b respectively included in the first and second electrodes P13 and P23 are formed after forming the cup-shaped first and second electrode bodies 330a and 330b (block S330).

At block S330, the target material TA is evaporated by the electron-beam evaporator 10 to form the first and second emitter surface metal layers 540a and 540b coated on the first and second electrode bodies 330a and 330b. Since the target material TA is evaporated, the target material TA does not include water. Additionally, the target material TA may include Cesium (Cs), and beryllium oxide (BeO), magnesium oxide (MgO), calcium oxide (CaO), strontium oxide (SrO), barium oxide (BaO), cesium oxide (CsO), radium oxide (RaO), etc.

The first and second electrode bodies 330a and 330b, and the first and second emitter surface metal layers 540a and 540b are disposed on the tube 310 (block S140). The tube 310 is filled with the mixed gas 380 including mercury, argon, neon, etc.

Therefore, the first and second emitter surface metal layers 540a and 540b, including metal materials capable of improving dark start characteristics, and metal materials of oxides having high electron emission efficiency, may be deposited on the first and second electrode bodies 330a and 330b. Therefore, a light flickering defect of the lamp caused by reaction between water molecules and a metal oxide may be removed.

According to embodiments of the present invention, a lamp electrode includes a metal material having high electron emission efficiency, thus, the temperature of the lamp electrode and lamp efficiency may be enhanced.

Therefore, the power consumption of the lamp may be reduced and dark start characteristics may be improved.

The foregoing is illustrative of the present disclosure and is not to be construed as limiting thereof. Although a few example embodiments of the present invention have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific example embodiments disclosed, and that modifications to the disclosed example embodiments, as well as other example embodiments, are intended to be included within the scope of the appended claims. The present disclosure is defined by the following claims, with equivalents of the claims to be included therein.

What is claimed is:

1. A lamp, comprising:
   a tube which forms a light-emitting space;
   an electrode main body disposed in the tube;
   a lamp lead extending from the electrode main body; and
   an emitter surface metal layer formed on the electrode main body,
   wherein the emitter surface metal layer comprising a surface metal and at least one oxide selected from the group consisting of alkali metal oxides and alkali earth metal oxides, and
   wherein the surface metal is substantially uniformly distributed in the emitter surface metal layer.

2. The lamp of claim 1, wherein the electrode main body includes at least one selected from the group consisting of nickel (Ni), molybdenum (Mo), niobium (Nb), tungsten (W), titanium (Ti), tantalum (Ta) and iron (Fe).

3. A liquid crystal display (LCD) apparatus, comprising:
   a LCD panel;
   a lamp providing light to the LCD panel, and including a tube which forms a light-emitting space, an electrode main body disposed in the tube, a lamp lead extending from the electrode main body, an emitter surface metal layer formed on the electrode main body; and
   an inverter providing a power to the lamp,
   wherein the emitter surface metal layer comprising a surface metal and at least one oxide selected from the group consisting of alkali metal oxides and alkali earth metal oxides, and
   wherein the surface metal is substantially uniformly distributed in the emitter surface metal layer.

4. The lamp of claim 2, wherein the surface metal includes cesium (Cs).

5. The lamp of claim 4, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

6. The lamp of claim 2, wherein the alkali metal oxides includes cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

7. The lamp of claim 1, wherein the surface metal includes cesium (Cs).

8. The lamp of claim 7, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

9. The lamp of claim 1, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

10. The liquid crystal display (LCD) apparatus of claim 3, wherein the electrode main body includes at least one selected from the group consisting of nickel (Ni), molybdenum (Mo), niobium (Nb), tungsten (W), titanium (Ti), tantalum (Ta) and iron (Fe).

11. The liquid crystal display (LCD) apparatus of claim 10, wherein the surface metal includes cesium (Cs).

12. The liquid crystal display (LCD) apparatus of claim 11, wherein the alkali metal oxides includes cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

13. The liquid crystal display (LCD) apparatus of claim 10, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

14. The liquid crystal display (LCD) apparatus of claim 3, wherein the surface metal includes cesium (Cs).

15. The liquid crystal display (LCD) apparatus of claim 14, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

16. The liquid crystal display (LCD) apparatus of claim 3, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

17. A lamp, comprising:
a tube which forms a light-emitting space;
an electrode main body disposed in the tube;
a lamp lead extending from the electrode main body; and
an emitter surface metal layer formed on the electrode main body,
wherein the emitter surface metal layer comprising a surface metal and at least one oxide selected from the group consisting of alkali metal oxides and alkali earth metal oxides, and
wherein the surface metal is substantially uniformly distributed in the emitter surface metal layer.

18. The lamp of claim 17, wherein the electrode main body includes at least one selected from the group consisting of nickel (Ni), molybdenum (Mo), niobium (Nb), tungsten (W), titanium (Ti), tantalum (Ta) and iron (Fe).

19. The lamp of claim 18, wherein the surface metal includes cesium (Cs).

20. The lamp of claim 19, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), cesium oxide (CsO) and radium oxide (RaO).

21. The lamp of claim 18, wherein the alkali metal oxides include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), cesium oxide (CsO) and radium oxide (RaO).

22. The lamp of claim 17, wherein the surface metal includes cesium (Cs).

23. The lamp of claim 22, wherein the alkali metal oxides includes cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

24. The lamp of claim 17, wherein the alkali metal oxide include cesium oxide (CsO) and the alkali earth metal oxides include at least one selected from the group consisting of beryllium oxide (BeO), magnesium oxide (MgO), calcium oxide (CaO), strontium oxide (SrO), barium oxide (BaO), and radium oxide (RaO).

* * * * *